US012620994B2

(12) United States Patent
Kim et al.

(10) Patent No.: US 12,620,994 B2
(45) Date of Patent: May 5, 2026

(54) FAST CALIBRATION OF PHASE LOCK LOOPS

(71) Applicant: Credo Technology Group Limited, George Town (KY)

(72) Inventors: Kyungjin Kim, San Jose, CA (US); Shunken Huang, Hsinchu (TW); Ni Xu, Santa Clara, CA (US); Alex Nazari, San Francisco, CA (US)

(73) Assignee: Credo Technology Group Limited, Grand Cayman (KY)

( * ) Notice: Subject to any disclaimer, the term of this patent is extended or adjusted under 35 U.S.C. 154(b) by 146 days.

(21) Appl. No.: 18/676,644

(22) Filed: May 29, 2024

(65) Prior Publication Data

US 2025/0373253 A1 Dec. 4, 2025

(51) Int. Cl.
 *H03L 7/10* (2006.01)
 *H03L 7/093* (2006.01)
 *H03L 7/18* (2006.01)
(52) U.S. Cl.
 CPC .............. *H03L 7/105* (2013.01); *H03L 7/093* (2013.01); *H03L 7/18* (2013.01)
(58) Field of Classification Search
 None
 See application file for complete search history.

(56) References Cited

U.S. PATENT DOCUMENTS

| | | | | |
|---|---|---|---|---|
| 4,379,270 A | * | 4/1983 | Carter | H03L 7/191 331/25 |
| 5,534,821 A | * | 7/1996 | Akiyama | H03L 7/0896 331/25 |
| 6,476,681 B1 | * | 11/2002 | Kirkpatrick | H03L 7/093 331/10 |
| 6,806,781 B2 | * | 10/2004 | Bisanti | H03B 5/1243 331/177 V |

(Continued)

FOREIGN PATENT DOCUMENTS

| | | | | |
|---|---|---|---|---|
| WO | WO-0119005 A1 | * | 3/2001 | H04J 3/0644 |
| WO | WO-2016048485 A2 | * | 3/2016 | H03L 1/00 |
| WO | WO-2020190873 A1 | * | 9/2020 | H03L 7/183 |

OTHER PUBLICATIONS

U.S. Appl. No. 18/387,731, filed Nov. 7, 2023 by inventors Kyungjin Kim, Wenzhe Gao, Alex Nazari, Chad Cohen and Xin Chang, titled: "Serdes With Robust Parameter Initialization".

(Continued)

*Primary Examiner* — Berhanu Tadese
(74) *Attorney, Agent, or Firm* — RAMEY LLP; Daniel J. Krueger

(57) ABSTRACT

Phase lock loop calibration methods can be accelerated, and the accelerated method incorporated in integrated circuits and systems. One illustrative calibration method for use in a controller determines a calibrated value of a calibration parameter for a phase lock loop configured to generate a clock signal. The method includes: finding a lower bound by stepping downward from an initial value of the calibration (Continued)

parameter while a frequency error remains below a predetermined threshold; finding an upper bound by stepping upward from the initial value while the frequency error remains below the predetermined threshold; and using a value greater than or equal to the lower bound and less than or equal to the upper bound as the calibrated value.

18 Claims, 3 Drawing Sheets

(56)                  References Cited

U.S. PATENT DOCUMENTS

| | | | | | |
|---|---|---|---|---|---|
| 7,023,249 | B1* | 4/2006 | Mulbrook | H03L 7/1976 | 375/376 |
| 7,295,078 | B2* | 11/2007 | Coppola | H03L 7/199 | 331/44 |
| 7,317,691 | B2* | 1/2008 | Mills | H04L 12/12 | 370/252 |
| 7,327,754 | B2* | 2/2008 | Mills | H04L 12/12 | 713/320 |
| 7,352,249 | B2* | 4/2008 | Balboni | H03C 3/0933 | 331/16 |
| 7,382,199 | B2* | 6/2008 | Talwalkar | H03L 7/187 | 331/16 |
| 7,602,256 | B2* | 10/2009 | Talwalkar | H03L 7/099 | 331/36 C |
| 7,714,667 | B2* | 5/2010 | Dai | H03L 7/18 | 331/11 |
| 7,755,439 | B2* | 7/2010 | Yu | H03C 3/0941 | 331/14 |
| 7,760,036 | B2* | 7/2010 | Sutardja | H03L 1/027 | 331/107 A |
| 7,786,817 | B2* | 8/2010 | Sutardja | H03L 1/027 | 331/107 A |
| 7,932,785 | B2* | 4/2011 | Drapkin | H03L 7/0891 | 331/16 |
| 8,040,173 | B2* | 10/2011 | Ikebe | H03B 27/00 | 455/326 |
| 8,130,321 | B2* | 3/2012 | Cappaert | H04N 5/06 | 348/537 |
| 8,179,174 | B2* | 5/2012 | Bunch | H03L 7/1976 | 327/147 |
| 8,427,353 | B2* | 4/2013 | Cheng | H03M 1/06 | 341/155 |
| 8,570,082 | B1* | 10/2013 | Kuo | H03L 1/00 | 327/158 |
| 9,065,242 | B2* | 6/2015 | Chen | H01S 5/06256 | |
| 9,455,727 | B2* | 9/2016 | Li | H03L 7/093 | |
| 9,571,111 | B1* | 2/2017 | Cranford, Jr. | H03L 7/103 | |
| 9,667,407 | B1* | 5/2017 | Liu | H03B 5/1212 | |
| 9,774,363 | B1* | 9/2017 | Tertinek | H04L 27/152 | |
| 9,935,640 | B1* | 4/2018 | Chan | H03C 3/0991 | |
| 9,979,432 | B2* | 5/2018 | Khan | H04B 1/40 | |
| 10,135,605 | B2* | 11/2018 | Yoo | H04L 7/033 | |
| 10,284,210 | B2* | 5/2019 | Li | H03L 5/00 | |
| 10,313,105 | B2* | 6/2019 | Gao | H04L 7/0025 | |
| 10,423,567 | B2* | 9/2019 | Khan | H04B 1/40 | |
| 10,437,279 | B2* | 10/2019 | Chang | G06F 1/10 | |
| 10,447,509 | B1* | 10/2019 | Cai | H04L 27/01 | |
| 10,605,860 | B2* | 3/2020 | Li | G01R 31/31703 | |
| 10,680,856 | B1* | 6/2020 | Miao | H04L 25/03324 | |
| 10,812,089 | B2* | 10/2020 | Leung | H03L 7/099 | |
| 10,892,763 | B1* | 1/2021 | Hidaka | H03L 7/0807 | |
| 10,992,501 | B1* | 4/2021 | Sun | H03L 7/07 | |
| 11,038,602 | B1* | 6/2021 | Sun | H04B 17/14 | |
| 11,119,559 | B1* | 9/2021 | Felix | G06F 1/06 | |
| 11,300,613 | B2* | 4/2022 | Aga | G01R 31/31709 | |
| 11,418,204 | B2* | 8/2022 | Gupta | H03L 7/0898 | |
| 11,424,968 | B1* | 8/2022 | Sun | H04L 25/4908 | |
| 11,451,417 | B1* | 9/2022 | Sun | H04L 25/03057 | |
| 11,644,884 | B2* | 5/2023 | Felix | G06F 1/06 | 713/322 |

| | | | | | |
|---|---|---|---|---|---|
| 11,831,473 | B2* | 11/2023 | Liao | H04L 25/03254 | |
| 11,831,475 | B1* | 11/2023 | Liao | H04L 1/0054 | |
| 11,848,681 | B2* | 12/2023 | Duan | H03M 1/46 | |
| 11,870,450 | B1* | 1/2024 | Cheng | H03L 7/0995 | |
| 11,936,505 | B2* | 3/2024 | Liao | H04L 25/03324 | |
| 11,959,995 | B2* | 4/2024 | Finocchiaro | G01S 13/34 | |
| 12,001,263 | B2* | 6/2024 | Felix | G06F 1/06 | |
| 12,088,310 | B2* | 9/2024 | Fortunato | H03L 7/087 | |
| 12,095,894 | B2* | 9/2024 | Hidaka | H04L 7/0029 | |
| 12,261,928 | B2* | 3/2025 | Liao | H04L 7/0016 | |
| 12,362,704 | B2* | 7/2025 | Familia | H03B 5/24 | |
| 12,375,329 | B2* | 7/2025 | Cai | H04L 27/0008 | |
| 12,401,488 | B1* | 8/2025 | Cai | H03L 7/0807 | |
| 12,461,887 | B1* | 11/2025 | Yu | G06F 13/4291 | |
| 12,483,448 | B2* | 11/2025 | Kim | H04L 25/03885 | |
| 2002/0033739 | A1* | 3/2002 | Bisanti | H03L 7/113 | 331/177 V |
| 2003/0161348 | A1* | 8/2003 | Mills | H04L 12/12 | 370/422 |
| 2003/0165142 | A1* | 9/2003 | Mills | H04L 12/12 | 370/395.62 |
| 2005/0062551 | A1* | 3/2005 | Coppola | H03B 5/1293 | 331/36 C |
| 2005/0073369 | A1* | 4/2005 | Balboni | H03C 3/0941 | 331/16 |
| 2007/0182494 | A1* | 8/2007 | Talwalkar | H03L 7/099 | 331/16 |
| 2008/0074544 | A1* | 3/2008 | Cappaert | G09G 5/008 | 348/537 |
| 2008/0204151 | A1* | 8/2008 | Talwalkar | H03L 7/104 | 331/10 |
| 2009/0115536 | A1* | 5/2009 | Dai | H03L 7/18 | 331/44 |
| 2009/0210185 | A1* | 8/2009 | Lajevardi | G01D 3/036 | 73/1.01 |
| 2010/0225375 | A1* | 9/2010 | Ikebe | H03B 27/00 | 327/361 |
| 2011/0304365 | A1* | 12/2011 | Bunch | H03L 7/1976 | 327/157 |
| 2012/0207247 | A1* | 8/2012 | Cheng | H03M 1/06 | 341/137 |
| 2013/0308663 | A1* | 11/2013 | Chen | H01S 5/06256 | 372/20 |
| 2016/0094231 | A1* | 3/2016 | Li | H03L 1/02 | 331/15 |
| 2016/0365866 | A1* | 12/2016 | Li | H03B 5/00 | |
| 2017/0220517 | A1* | 8/2017 | Khan | H04L 49/35 | |
| 2017/0222684 | A1* | 8/2017 | Khan | H04B 1/40 | |
| 2017/0222685 | A1* | 8/2017 | Khan | H04B 1/40 | |
| 2017/0222686 | A1* | 8/2017 | Khan | H04B 1/40 | |
| 2018/0183567 | A1* | 6/2018 | Yoo | H04L 7/033 | |
| 2018/0351561 | A1* | 12/2018 | Zhao | H03L 7/1976 | |
| 2019/0041455 | A1* | 2/2019 | Li | G01R 31/31703 | |
| 2019/0081772 | A1* | 3/2019 | Gao | H04L 7/0331 | |
| 2019/0187744 | A1* | 6/2019 | Chang | G11C 7/1039 | |
| 2020/0201412 | A1* | 6/2020 | Felix | G06F 1/324 | |
| 2020/0304130 | A1* | 9/2020 | Leung | H03L 7/099 | |
| 2021/0242861 | A1* | 8/2021 | Sun | H04B 3/04 | |
| 2021/0373637 | A1* | 12/2021 | Felix | G06F 1/06 | |
| 2022/0043136 | A1* | 2/2022 | Finocchiaro | G01S 13/34 | |
| 2022/0082618 | A1* | 3/2022 | Aga | G01R 31/318513 | |
| 2022/0113939 | A1* | 4/2022 | Luo | G06F 7/50 | |
| 2022/0173941 | A1* | 6/2022 | Sun | H04B 1/12 | |
| 2022/0200607 | A1* | 6/2022 | Gupta | H03L 7/08 | |
| 2023/0092151 | A1* | 3/2023 | Urakawa | H03L 7/099 | 327/156 |
| 2023/0155549 | A1* | 5/2023 | Familia | H03B 5/1243 | 331/34 |
| 2023/0208414 | A1* | 6/2023 | Duan | H03K 5/249 | 327/65 |
| 2023/0254188 | A1* | 8/2023 | Cai | H04L 27/0008 | 375/353 |
| 2023/0308315 | A1* | 9/2023 | Liao | H04L 25/03057 | |
| 2023/0315189 | A1* | 10/2023 | Felix | G06F 1/06 | 713/322 |
| 2023/0318883 | A1* | 10/2023 | Liao | H04L 25/03057 | 375/233 |

(56) References Cited

U.S. PATENT DOCUMENTS

| | | | | |
|---|---|---|---|---|
| 2023/0327677 A1* | 10/2023 | Fortunato | ............... | H03L 7/099 |
| | | | | 331/1 R |
| 2024/0187204 A1* | 6/2024 | Hidaka | ................. | H04L 7/0029 |
| 2024/0210550 A1* | 6/2024 | Finocchiaro | ............ | G01S 13/34 |
| 2025/0038944 A1* | 1/2025 | Liao | ........................... | H04L 7/10 |
| 2025/0150312 A1* | 5/2025 | Kim | .................... | H04L 25/4917 |
| 2025/0274259 A1* | 8/2025 | Hidaka | ................... | H04L 7/033 |
| 2025/0286545 A1* | 9/2025 | Kim | ......................... | H03K 5/22 |
| 2025/0337412 A1* | 10/2025 | Hazra | ....................... | H03L 7/18 |

OTHER PUBLICATIONS

U.S. Appl. No. 18/596,953, filed Mar. 6, 2024 by inventors Kyungjin Kim, Haihui Luo, Shunken Huang and Junqing Sun, titled: "Adaptive Comparator Calibration".

U.S. Appl. No. 18/641,575, filed Apr. 22, 2024 by inventors Fang Cai, Xin Chang, Junqing Sun and Haoli Qian, titled: "Dynamic Timing Loop Gain to Compensate Phase Interpolation Nonlinearities".

* cited by examiner

FIG. 1
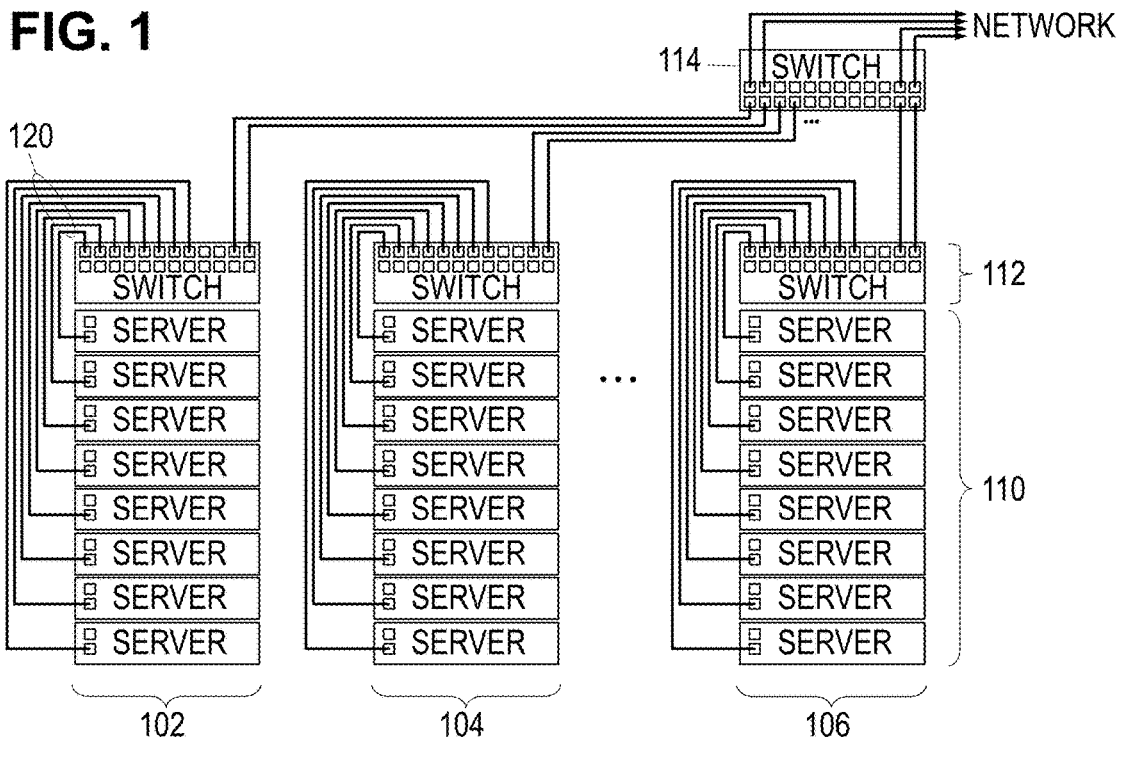
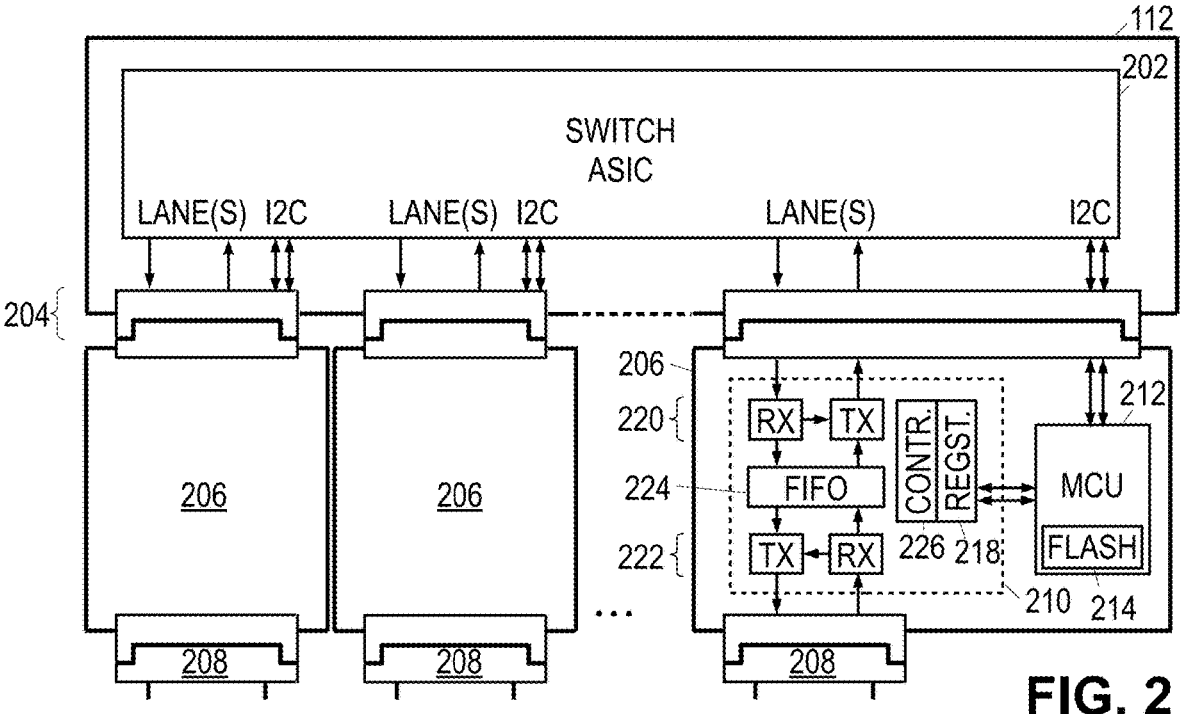
FIG. 2

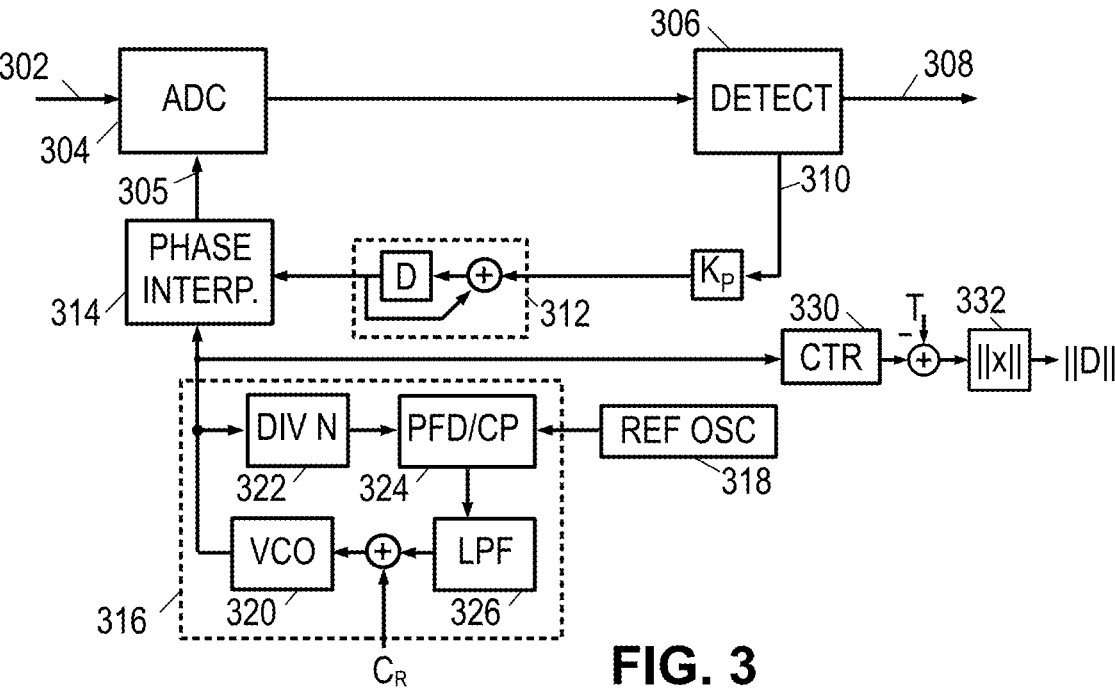
FIG. 3
FIG. 4
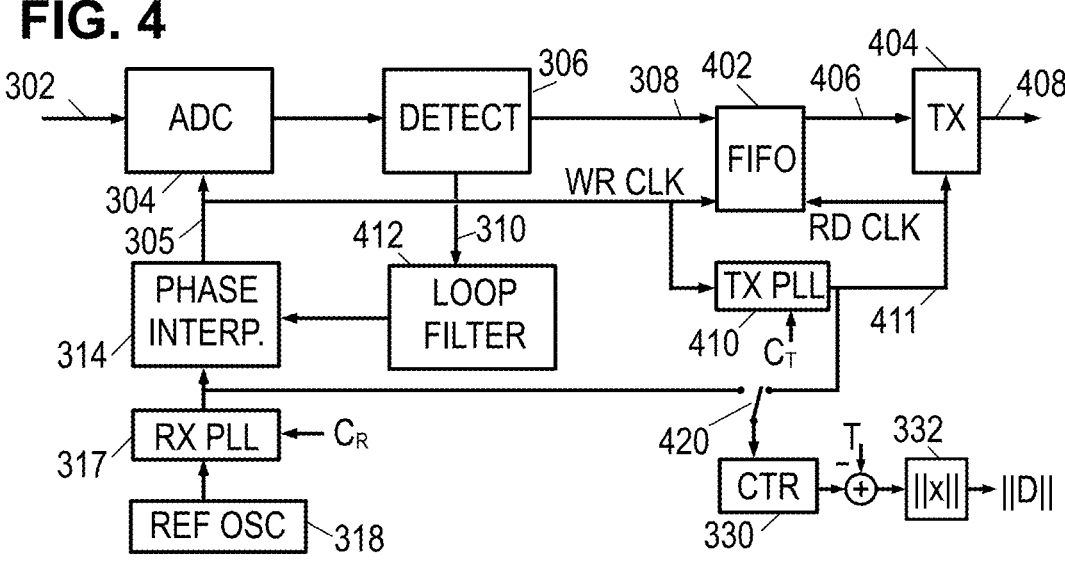

| C | D |
|---|---|
| 0 | 2640 |
| 1 | 1905 |
| 2 | 1219 |
| 3 | 531 |
| 4 | 6 |
| 5 | 6 |
| 6 | 6 |
| 7 | 6 |
| 8 | 6 |
| 9 | 6 |
| 10 | 5 |
| 11 | -361 |
| 12 | -891 |
| 13 | -1520 |
| 14 | -2102 |
| 15 | -2694 |

602→

604→

START

SET C=START, FIND ‖D‖
702

‖D‖≤M?  704   —N→   SET C=0   720

Y

SET C=C-δ, FIND ‖D‖
706

‖D‖>M?  708
N

Y

SET L=C+δ, SET C=START
710

SET C=C+δ, FIND ‖D‖
712

‖D‖>M?  714
N

Y

SET U=C-δ
716

SET C=⌊(U+L)/2⌋
718

FIND ‖D‖
722

‖D‖≤M?  724   —N→   C<C$_{MAX}$?  726
Y                              Y   N

SET L=C
728

SET C=C+1, FIND ‖D‖
730

‖D‖>M?  732
N                Y

SET U=C-1
734

SET C=C+1
727

FAILED CALIBRATION

SUCCESSFUL CALIBRATION

FAST CALIBRATION OF PHASE LOCK LOOPS

FIELD OF TECHNOLOGY

The present invention relates generally to start-up processes for integrated circuits and, more particularly, to a technique for quickly calibrating one or more phase lock loops in an integrated circuit.

BACKGROUND

Digital communications occur between sending and receiving devices over an intermediate communications medium, or "channel" (e.g., a fiber optic cable, insulated copper wire, or a wireless connection). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period, called a "symbol interval". A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation ("PAM4"), each symbol interval may carry any one of four symbols, often denoted as −3, −1, +1, and +3. Two binary bits can thus be represented by each symbol.

As part of the process for recovering digital data from the degraded analog signal, receivers obtain discrete samples of the signal. The sample timing is often a critical part of the process, as it directly affects the signal to noise ratio possessed by the discrete samples. Strategies for detecting and tracking optimal sample times exist with varying degrees of tradeoff between simplicity and performance, often relying on interpolation of a high frequency clock signal generated by a phase lock loop. For example, the Institute of Electrical and Electronics Engineers (IEEE) has published IEEE Std 802.3ba-2010, a standard which provides for Ethernet communications at rates as high as 100 Gb/s. The standard specifies multiple channels each having a symbol signaling rate as high as 25 Gb/s.

Phase lock loops may be designed to derive a low-jitter 25 GHz clock signal from a more typical integrated circuit clock frequency of, e.g., 100 MHz. As with other integrated circuit designs, the chosen phase lock loop design must cope with potential changes in performance of its components due to process variation, supply voltage variation, and temperature variation (collectively, "PVT variations") as well as drift due to component aging. The chosen design may accommodate one or more parameters that can be adjusted as part of a periodic calibration process to compensate for such changes.

Such calibration is often part of the reset or power-on process of an integrated circuit. It should be noted that various components having phase lock loops (e.g., receivers, transmitters) may be unable to operate until suitable calibrated values are determined for adjustable parameters of the phase lock loops. Where a fast start-up is desired, it is desirable to ensure fast completion of the phase lock loop calibration process.

SUMMARY

Accordingly, there are disclosed herein fast calibration methods for phase lock loops as well as integrated circuits and systems that incorporate such methods. One illustrative calibration method for use in a controller determines a calibrated value of a calibration parameter for a phase lock loop configured to generate a clock signal. The method includes: finding a lower bound by stepping downward from an initial value of the calibration parameter while a frequency error remains below a predetermined threshold; finding an upper bound by stepping upward from the initial value while the frequency error remains below the predetermined threshold; and using a value greater than or equal to the lower bound and less than or equal to the upper bound as the calibrated value.

One illustrative integrated circuit includes a phase lock loop and a controller configured to implement the above calibration method. The calibration method may illustratively be embodied on a non-transient information storage medium coupled to a controller to provide firmware that configures the controller to implement the calibration method.

Each of the foregoing may be employed alone or in combination, together with any one or more of the following optional features in any suitable combination: 1. the controller is configured to determine a cycle count of the clock signal in a predetermined time. 2. the controller is configured to measure the frequency error as an absolute value of a difference between the cycle count and a predetermined target count. 3. if the frequency error exceeds the predetermined threshold for the initial value of the calibration parameter the controller is configured to perform a bottom-up or top-down search to find the lower bound and the upper bound. 4. a step size for said stepping downward and said stepping upward is at least twice a step size of the bottom-up or top-down search. 5. the calibrated value is an integer closest to an average of the upper bound and the lower bound. 6. the initial value is the calibrated value determined during previous operation of the integrated circuit. 7. the phase lock loop is part of a first receiver having: a sampling element configured to sample a receive signal in accordance with a sampling clock; and a clock recovery circuit that derives the sampling clock from the clock signal. 8. the first receiver is one of multiple receivers in the integrated circuit. 9. the controller is configured to use the calibrated value for the phase lock loop of the first receiver as an initial value of the calibration parameter for a phase lock loop of another one of the multiple receivers. 10. a transmitter having a transmit phase lock loop with a transmit calibration parameter. 11. the controller is configured to use the calibrated value for the phase lock loop of the first receiver as an initial value of the transmit calibration parameter. 12. the phase lock loop includes a voltage-controlled oscillator with a variable capacitor. 13. the calibration parameter is a baseline voltage of the variable capacitor.

BRIEF DESCRIPTION OF THE DRAWINGS

FIG. 1 shows an illustrative network.
FIG. 2 is a block diagram of an illustrative switch.

FIG. 3 is a block diagram of an illustrative digital communications receiver.

FIG. 4 is a block diagram of an illustrative digital retimer with clock forwarding.

DETAILED DESCRIPTION

Figures 5, 6, 7:
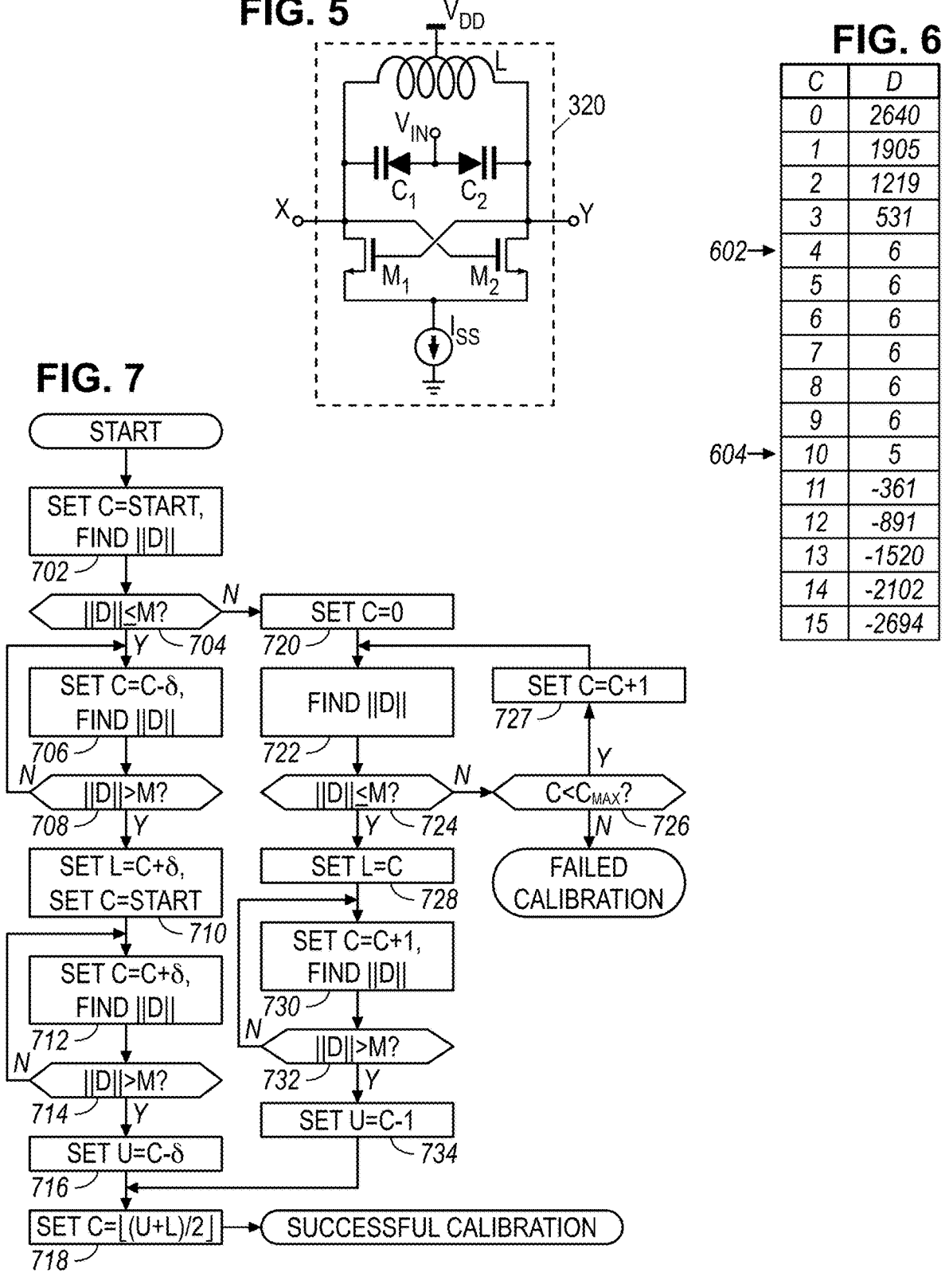
FIG. 5 is a schematic of an illustrative voltage-controlled oscillator.
FIG. 6 is a table of an illustrative frequency error vs calibration value measurements.
FIG. 7 is a flow diagram of an illustrative calibration method.

Note that the specific embodiments given in the drawings and following description do not limit the disclosure. On the contrary, they provide the foundation for one of ordinary skill to discern the alternative forms, equivalents, and modifications that are encompassed in the claim scope.

For context, FIG. 1 shows an illustrative network such as might be found in a data processing center, with multiple server racks 102-106 each containing multiple servers 110 and at least one "top of rack" (TOR) switch 112. The TOR switches 112 are connected to aggregator switches 114 for interconnectivity and connection to the regional network and internet. (As used herein, the term "switch" includes not just traditional network switches, but also routers, network bridges, hubs, and other devices that forward network communication packets between ports.) Each of the servers 110 is connected to the TOR switches 112 by network cables 120, which may convey signals at high symbol rates.

FIG. 2 shows an illustrative switch 112 with an application-specific integrated circuit (ASIC) 202 that implements packet-switching functionality coupled to port connectors 204 for line cards or "pluggable modules" 206. Pluggable modules 206 couple between the port connectors 204 and cable connectors 208 to improve communications performance by way of equalization and optional format conversion (e.g., converting between electrical and optical signals). The pluggable modules 206 may comply with any one of various pluggable module standards including SFP, SFP-DD, QSFP, QSFP-DD, and OSFP. Alternatively, the cables themselves may have connectors that conform to the pluggable module standards and incorporate the pluggable module circuitry.

The pluggable modules 206 may each include a retimer chip 210 and a microcontroller chip 212 that controls operation of the retimer chip 210 in accordance with firmware and parameters that may be stored in nonvolatile memory 214 or other form of non-transient information storage media. The operating mode and parameters of the pluggable retimer modules 206 may be set via a two-wire bus such as I2C or MDIO that connects the microcontroller chip 212 to the host device (e.g., switch 112). The microcontroller chip 212 responds to queries and commands received via the two-wire bus, and responsively retrieves information from and saves information to control registers 218 of the retimer chip 210.

Retimer chip 210 includes a host-side transceiver 220 coupled to a line-side transceiver 222 by first-in first-out (FIFO) buffers 224. Though only a single lane is shown in the figure, the transceivers may support multiple lanes conveyed via multiple corresponding optical fibers or electrical conductors. A controller 226 coordinates the operation of the transceivers in accordance with the control register contents and may provide for multiple communication phases pursuant to a communications standard such as the Fibre Channel Standard published by the American National Standard for Information Technology Accredited Standards Committee INCITS, which provides phases for link speed negotiation (LSN), equalizer training, and normal operation.

The receiver portion of each transceiver may employ any of the many equalization and demodulation techniques disclosed in the open literature for recovering digital data from the degraded receive signal even in the presence of ISI. A critical piece of such techniques is a determination of the correct sample timing, as sample timing directly affects the signal to noise ratio of the discrete samples. Strategies for detecting and tracking optimal sample times exist with varying degrees of tradeoff between simplicity and performance, including those disclosed in co-owned U.S. Pat. No. 10,892,763, "Second-order clock recovery using three feedback paths", which is hereby incorporated herein in its entirety.

FIG. 3 shows an illustrative receiver that employs a clock recovery technique. The receiver includes an analog-to-digital converter 304 or other sampling element that samples the analog receive signal 302 at sample times corresponding to transitions in a sampling signal 305, thereby providing a digital or sampled receive signal to a detection module 306. The detection module 306 may apply equalization as well as symbol detection using, e.g., a matched filter, a decision feedback equalizer, a maximum likelihood sequence estimator, or any other suitable demodulation technique. The resulting stream of detected symbols 308 may be provided as a parallelized symbol stream for handling by "on-chip" circuitry, e.g., error correction and FIFO buffering.

The detection module 306 includes some form of a timing error estimator to generate an estimated timing error signal 310. Any suitable design may be used for the timing error estimator including, e.g., a bang-bang or proportional phase detector. One suitable timing error estimator is set forth in co-owned U.S. Pat. No. 10,447,509, "Precompensator-based quantization for clock recovery", which is hereby incorporated herein by reference in its entirety. Other suitable timing error estimators can be found in the open literature, including, e.g., Mueller et al., "Timing Recovery in Digital Synchronous Data Receivers", IEEE Trans. Commun., v24n5, May 1976, and Musa, "High-speed Baud-Rate Clock Recovery", U. Toronto Thesis, 2008.

The timing error signal 310 is coupled via a feedback path to control a phase interpolator 314 in a fashion that statistically minimizes the timing error signal 310. In the feedback path, the timing error signal is scaled by a phase coefficient ($K_P$) and filtered by a phase error accumulator 312 to obtain a phase code signal that is supplied as a control signal to the phase interpolator 314. The phase interpolator 314 operates on a clock signal from a phase lock loop (PLL) 316. The phase interpolator 314 may receive or construct different phases of the clock signal, combining the different phases in accordance with the control signal to provide the sampling signal 305 having an interpolated phase more precisely matched to the symbols conveyed by the receive signal 302.

The clock signal produced by phase lock loop (PLL) 316 is a frequency-multiplied version of a reference clock signal from reference oscillator 318. A voltage-controlled oscillator (VCO) 320 supplies the clock signal to both the phase interpolator 314 and to a counter 322 that divides the frequency of the clock signal by a constant modulus N. The counter 322 supplies the divided-frequency clock signal to a phase-frequency detector (PFD) 324. PFD 324 may use a charge pump (CP) as part of determining which input (i.e., the divided-frequency clock signal or the reference clock signal) has transitions earlier or more often than the other. A low pass filter 326 filters the output of PFD 324. A summer adds a receiver PLL calibration parameter signal $C_R$ to the output of the low pass filter 326 to provide a control voltage to VCO 320. The filter parameters are chosen so that the divided frequency clock becomes phase aligned with the reference oscillator, and the calibration parameter signal $C_R$ is adjustable to compensate for potential PVT variations and drift.

The phase interpolator 314 is configured to interpolate the phase in discrete steps from 0 to 360°. A 7-bit control signal would enable 128 steps for a phase resolution of ~2.8°. Other resolutions would also be suitable. In any case, the phase error accumulator 312 may be implemented with a higher bit resolution for improved performance, with the control signal being derived using truncation of the least significant bit(s). For various implementation reasons, the 360° interpolation range of the phase interpolator 314 may correspond to multiple symbol intervals, e.g., four, consequently reducing the number of phase increments per unit interval to, e.g., 32. The sub-unit phase may be determined by excluding the most significant bit(s) of the phase interpolator control signal.

To monitor PLL performance, a counter 330 may be employed to measure the frequency of the generated clock signal by, e.g., counting the number of clock cycles in a predetermined time interval such as, e.g., 1 millisecond. The controller 226 determines a difference D between this cycle count and a target count, which represents the expected clock signal frequency. The controller 226 optionally applies an absolute value operation 332 to obtain an absolute value of the difference ||D||. Though the feedback-based nature of the phase lock loop 316 provides a degree of stability, the calibration parameter signal $C_R$ can nevertheless affect the difference D as described further below.

FIG. 4 shows an illustrative retimer that combines the receiver design of FIG. 3 with a buffer 402 and transmitter 404. Buffer 402 stores detected symbols 308 in a first-in first-out (FIFO) fashion. Transmitter 404 retrieves the buffered symbol stream 406 and retransmits it as an outgoing data stream 408. A transmit phase lock loop 410 provides a transmit clock 411 to the transmitter 404 to control the symbol timing in the outgoing data stream 408. The FIFO may accept sample clock 305 as a write clock for storing detected symbols 308 and may accept transmit clock 411 as a read clock for providing buffered symbols to the transmitter 404. Loop filter block 412 represents the filter(s) and feedback path(s) circuitry that converts the phase error signal 310 into a phase control signal for interpolator 314.

The transmit PLL 410 derives the transmit clock from the sample clock signal 305 and as with receive PLL 317 may be adversely affected by parameter drift and PVT variations. To provide compensation, a transmit PLL calibration parameter signal CT may similarly be added to the output of an internal low pass filter to provide a control voltage to an internal VCO.

For PLL performance monitoring, a switch 420 supplies a selected one of the clock signals generated by the receive PLL 317 and transmit PLL 410, to counter 330. As before, the cycle count for a predetermined interval may be compared to a target count T to obtain a difference D. The difference represents a frequency error from an expected clock frequency represented by target count T. As explained further below, the controller 226 may determine the frequency error's dependence on the PLL calibration parameter value.

FIG. 5 shows an illustrative circuit schematic for VCO 320 to illustrate the potential influence of a calibration parameter. Many other suitable VCO circuits are available in the open literature and can alternatively be employed. When power is first applied, the transistors M1, M2 are both off and currents begin flowing through the halves of inductor L to charge the capacitors (varactors) C1, C2 relative to the control signal voltage (VIN), raising the voltage at nodes X, Y. One of the nodes, say node Y, charges slightly faster, causing transistor M1 to conduct while transistor M2 is still off. Current source $I_{SS}$ reduces the voltage at node X, momentarily "latching" the transistors in their state. Due to the inductor current, the node Y voltage continues to increase charging capacitor C2 beyond the supply voltage $V_{DD}$ until the inductor current is suppressed and begins flowing in the opposite direction, pulling the node Y voltage down to a level that causes transistor M1 to turn off and, because the inductor current flow exceeds $I_{SS}$, raises the voltage at node X, causing transistor M2 to turn on. Thereafter, the inductor current and capacitor charges oscillate at a frequency determined by the inductor's inductance and the varactor's capacitance.

The transistors M1, M2 enable the current source $I_{SS}$ to "boost" the inductor currents at the right moments to sustain the oscillation. If the voltages from nodes X, Y are supplied to a differential amplifier, a digital clock signal is produced at the resonance frequency. Capacitors C1, C2 may be voltage-controlled capacitors, enabling the resonance frequency to be controlled by a bias voltage on the capacitors. The bias voltage may be set at an initial level by the calibration parameter and thereafter adjusted by the output of the low pass filter 326 to achieve phase lock between the generated clock signal and the reference clock signal. If the initial bias voltage is set too high or too low, the low pass filter 326 may be unable to provide enough adjustment for the PLL to achieve phase lock.

FIG. 6 is an illustrative table of frequency error (represented by difference D) as a function of the value of PLL calibration parameter C. (The digital calibration parameter values may be converted to an analog voltage by a digital to analog converter.) The illustrative table shows sixteen settings for the PLL calibration parameter C, but in practice the number of settings may be higher or lower. As can be seen from the table, the frequency error exhibits a zone of stability between a lower bound 602 and upper bound 604 where the PLL achieves phase lock. The absolute value of the frequency error grows with distance from this zone.

The target count T is readily derived from the symbol clock frequency specified in the relevant communications standard and the predetermined time interval used by counter 330. The standard typically specifies an acceptable frequency error margin, or one may be determined empirically. Knowing the predetermined time interval, this frequency error margin can be similarly converted to a margin count M, perhaps with an enhancement to provide additional engineering margin. If the frequency error difference D is between +M and −M, or equivalently, if the absolute value of difference D is less than M, the controller 226 can presume that the PLL has achieved a phase lock.

Due to various environmental factors or even, in some cases, intentional frequency modulation, the symbol clock frequency may vary relative to the reference clock frequency. To enhance the PLL's ability to track such variations, the calibration process may be designed to set the calibration parameter to a value between lower and upper bounds, preferably somewhere near the middle of this zone. It is also noted here that in devices having multiple receivers and transmitters operating with the same symbol clock frequency, there is a high degree of correlation among the ideal calibration settings for their various PLLs. The calibration process disclosed here with reference to FIG. 7 exploits these observations to substantially shorten the average time required for the calibration process.

The process begins in block 702 with the controller setting the calibration parameter C for a given phase lock loop to an initial value START and finding the resultant frequency error D and absolute value thereof. Where a previous calibrated value is known (e.g., during a reset), the controller may use that as the initial value. Where a previous calibrated value is not available for the given PLL, but a calibrated value has been found for another PLL, the controller may use that as the initial value. Where calibrated values are unknown for any of the PLLs on a given device, the controller may use a default value as the initial value. The default value may be determined empirically by the manufacturer. In the absence of an empirical value, the controller may use a midrange value as the initial value.

In block 704 the controller determines whether the absolute value of the frequency error D is less than or equal to the margin M. If so, the controller reduces the value of the calibration parameter C by a predetermined step value δ and finds the associated frequency error D and absolute value thereof. The manufacturer selects the step size δ to balance two considerations: a larger step size enables faster location of upper and lower bounds, whereas a smaller step size increases search accuracy. In some implementations, the step size is chosen to be approximately a quarter of the expected zone size. For the illustrative table of FIG. 6, the step size δ may be set to two.

In block 708 the controller determines whether the absolute value of the frequency error D is greater than the margin M. If not, the controller repeats blocks 706 and 708, stepping downward through the calibration parameter values until the magnitude of the frequency error exceeds the margin M. Once the magnitude of the frequency error exceeds the margin, the controller sets the lower bound L equal to the previous value of the calibration parameter in block 710, and resets the calibration parameter to the initial value START.

In block 712, the controller increases the value of the calibration parameter by the step size δ and finds the associated frequency error D and absolute value thereof. In block 714, the controller determines whether the absolute value of the frequency error is greater than the margin M. If not, the controller repeats blocks 712 and 714, stepping upward through the calibration parameter values until the absolute value of the frequency error exceeds the margin M. Once the magnitude of the frequency error exceeds the margin, the controller sets the upper bound U equal to the last calibration parameter value that had a frequency error magnitude below or equal to the threshold.

In block 718, the controller sets the calibration parameter equal to a calibrated value between the upper and lower bounds. In at least some embodiments, the calibrated value is midway between the upper and lower bounds, or the integer value nearest thereto. Block 718 completes the calibration process for the given PLL. The process may be repeated sequentially or in parallel for any other PLLs on the device.

Returning to block 704, if the magnitude of the frequency error exceeds the margin, meaning that the initial calibration parameter value is not in the zone between upper and lower bounds, the controller prepares for a bottom-up or top-down search by setting the calibration parameter to the corresponding extreme value in block 720. In FIG. 7, the calibration parameter is set to its minimum value, zero.

In block 722, the controller finds the magnitude of the frequency error, and in block 724 determines whether it is less than or equal to the margin M. If not, in block 726 the controller determines whether the calibration value has reached the opposite extreme, e.g., its maximum value Cmax. If so, the full range of calibration values has been searched without achieving a phase lock, so the calibration process exits with an error to signal failed calibration.

Otherwise, in block 727, the controller steps to the next calibration parameter value. Preferably the controller uses the minimum step size, i.e., one, to ensure that the search is exhaustive. The controller repeats blocks 722-727 until the frequency error magnitude is less than or equal to the margin or the process fails as described above.

When the frequency error magnitude falls to or below the margin M, the controller sets the lower bound L equal to the current calibration parameter value C in block 728. In block 730, the controller increases the value of the calibration parameter value by another step size and finds the frequency error magnitude. In block 732, the controller determines whether the frequency error magnitude exceeds the margin M. If not, the controller repeats blocks 730 and 732 until the frequency error magnitude exceeds the margin M. Once the frequency error magnitude exceeds the margin M, the controller sets the upper bound U equal to the previous value of the calibration parameter in block 734. Thereafter the controller uses the lower and upper bounds to set the calibrated value of the calibration parameter in block 718 as previously described.

Numerous alternative forms, equivalents, and modifications will become apparent to those skilled in the art once the above disclosure is fully appreciated. The order of operations described in the flow diagram can be varied, with certain operations being reordered, pipelined and/or performed in parallel. It is intended that the claims be interpreted to embrace all such alternative forms, equivalents, and modifications where applicable.

What is claimed is:

1. An integrated circuit that comprises:
   a phase lock loop configured to generate a clock signal, the phase lock loop having a calibration parameter that is adjustable over a predetermined range; and
   a controller configured to determine a calibrated value for the calibration parameter by:
      finding a lower bound by stepping downward from an initial value of the calibration parameter while a frequency error remains below a predetermined threshold;
      finding an upper bound by stepping upward from the initial value while the frequency error remains below the predetermined threshold; and
      using a value greater than or equal to the lower bound and less than or equal to the upper bound as the calibrated value,
   wherein the controller is further configured to:
      determine a cycle count of the clock signal in a predetermined time; and
      measure the frequency error as an absolute value of a difference between the cycle count and a predetermined target count.

2. The integrated circuit of claim 1, wherein if the frequency error exceeds the predetermined threshold for the initial value of the calibration parameter the controller is configured to perform a bottom-up or top-down search to find the lower bound and the upper bound.

3. The integrated circuit of claim 2, wherein a step size for said stepping downward and said stepping upward is at least twice a step size of the bottom-up or top-down search.

4. The integrated circuit of claim 1, wherein the calibrated value is an integer closest to an average of the upper bound and the lower bound.

5. The integrated circuit of claim 1, wherein the initial value is the calibrated value determined during previous operation of the integrated circuit.

6. The integrated circuit of claim 1, wherein the phase lock loop is part of a first receiver having:

a sampling element configured to sample a receive signal in accordance with a sampling clock; and a clock recovery circuit that derives the sampling clock from the clock signal.

7. The integrated circuit of claim 6, wherein the first receiver is one of multiple receivers in the integrated circuit, and wherein the controller is configured to use the calibrated value for the phase lock loop of the first receiver as an initial value of the calibration parameter for a phase lock loop of another one of the multiple receivers.

8. The integrated circuit of claim 6, further comprising a transmitter having a transmit phase lock loop with a transmit calibration parameter, wherein the controller is configured to use the calibrated value for the phase lock loop of the first receiver as an initial value of the transmit calibration parameter.

9. The integrated circuit of claim 1, wherein the phase lock loop includes a voltage-controlled oscillator with a variable capacitor, and wherein the calibration parameter is a baseline voltage of the variable capacitor.

10. A calibration method for use in a controller configured to determine a calibrated value of a calibration parameter for a phase lock loop configured to generate a clock signal, the method comprising:

finding a lower bound by stepping downward from an initial value of the calibration parameter while a frequency error remains below a predetermined threshold;

finding an upper bound by stepping upward from the initial value while the frequency error remains below the predetermined threshold; and using a value greater than or equal to the lower bound and less than or equal to the upper bound as the calibrated value, wherein the frequency error is determined by:

subtracting a cycle count of the clock signal in a predetermined time from a predetermined target count to obtain a difference; and taking an absolute value of the difference.

11. The calibration method of claim 10, wherein if the frequency error exceeds the predetermined threshold for the initial value of the calibration parameter the method further includes performing a bottom-up or top-down search to find the lower bound and the upper bound.

12. The calibration method of claim 11, wherein a step size for said stepping downward and said stepping upward is at least twice a step size of the bottom-up or top-down search.

13. The calibration method of claim 10, wherein the calibrated value is an integer closest to an average of the upper bound and the lower bound.

14. The calibration method of claim 10, wherein the initial value is the calibrated value determined during previous operation of the integrated circuit.

15. The calibration method of claim 10, wherein the phase lock loop is one of multiple phase lock loops in an integrated circuit, and wherein the initial value of the calibration parameter for one of the multiple phase lock loops is a calibrated value of the calibration parameter for another one of the multiple phase lock loops.

16. The calibration method of claim 10, wherein the phase lock loop includes a voltage-controlled oscillator with a variable capacitor, and wherein the calibration parameter is a baseline voltage of the variable capacitor.

17. A non-transient information storage medium coupled to a controller to provide firmware that configures the controller to implement a calibration method to determine a calibrated value of a calibration parameter for a phase lock loop configured to generate a clock signal, the calibration method comprising:

finding a lower bound by stepping downward from an initial value of the calibration parameter while a frequency error remains below a predetermined threshold;

finding an upper bound by stepping upward from the initial value while the frequency error remains below the predetermined threshold; and using a value greater than or equal to the lower bound and less than or equal to the upper bound as the calibrated value, wherein if the frequency error exceeds the predetermined threshold for the initial value of the calibration parameter the calibration method further includes:

performing a bottom-up or top-down search to find the lower bound and the upper bound, wherein a step size for said stepping downward and said stepping upward is at least twice a step size of the bottom-up or top-down search.

18. The non-transient information storage medium of claim 17, wherein the frequency error is determined by subtracting a cycle count of the clock signal in a predetermined time from a predetermined target count to obtain a difference and taking an absolute value of the difference.

* * * * *